United States Patent
Chung et al.

(10) Patent No.: US 12,189,426 B2
(45) Date of Patent: Jan. 7, 2025

(54) FLEXIBLE DISPLAY APPARATUS

(71) Applicant: LG ELECTRONICS INC., Seoul (KR)

(72) Inventors: Hoseok Chung, Seoul (KR); Jinwoo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 180 days.

(21) Appl. No.: 17/602,465

(22) PCT Filed: Apr. 10, 2019

(86) PCT No.: PCT/KR2019/004306
§ 371 (c)(1),
(2) Date: Oct. 8, 2021

(87) PCT Pub. No.: WO2020/209403
PCT Pub. Date: Oct. 15, 2020

(65) Prior Publication Data
US 2022/0206536 A1  Jun. 30, 2022

(51) Int. Cl.
*G06F 1/16* (2006.01)
(52) U.S. Cl.
CPC .......... *G06F 1/1652* (2013.01); *G06F 1/1675* (2013.01)
(58) Field of Classification Search
CPC .............................. G06F 1/1652; G06F 1/1675
See application file for complete search history.

(56) References Cited

U.S. PATENT DOCUMENTS

| | | | | |
|---|---|---|---|---|
| 8,516,728 | B2* | 8/2013 | Jung | G09F 9/301 |
| | | | | 40/607.01 |
| 9,874,905 | B2* | 1/2018 | Song | G06F 1/1652 |
| 10,564,676 | B2* | 2/2020 | Kwon | H04N 5/64 |
| 10,671,179 | B2* | 6/2020 | Xia | G06F 3/03547 |
| 10,881,009 | B2* | 12/2020 | Jiang | H05K 5/0017 |
| 11,212,927 | B2* | 12/2021 | Zhu | G09F 9/3026 |
| 2010/0171401 | A1* | 7/2010 | Larson | A47B 3/0912 |
| | | | | 312/249.11 |
| 2011/0304562 | A1* | 12/2011 | Wu | G06F 3/03547 |
| | | | | 345/173 |
| 2012/0037643 | A1* | 2/2012 | Matt | A45C 11/20 |
| | | | | 220/592.2 |

(Continued)

FOREIGN PATENT DOCUMENTS

| | | |
|---|---|---|
| JP | 2011-49411 A | 3/2011 |
| KR | 10-2016-0081786 A | 7/2016 |

(Continued)

*Primary Examiner* — Abhishek M Rathod
(74) *Attorney, Agent, or Firm* — Birch, Stewart, Kolasch & Birch, LLP

(57) ABSTRACT

Disclosed is a flexible display apparatus characterized by comprising: a first body; a flexible display configured to be inserted into the first body or withdrawn from the first body, while being deformed by an external force; a second body coupled to one end of the flexible display; and a rear surface plate coupled to a rear surface portion of the flexible display and configured to deform together with the flexible display, wherein the flexible display deforms so as to be windable while being inserted into the first body, and deforms so as to be unfolded while being withdrawn from the first body.

15 Claims, 12 Drawing Sheets

(56) References Cited

U.S. PATENT DOCUMENTS

| | | | | |
|---|---|---|---|---|
| 2012/0222931 | A1* | 9/2012 | Zuckerman | A45C 5/03 |
| | | | | 190/2 |
| 2013/0016497 | A1* | 1/2013 | Anderson | G09F 13/22 |
| | | | | 362/97.1 |
| 2013/0114098 | A1* | 5/2013 | LeGrande | G03B 29/00 |
| | | | | 358/1.13 |
| 2016/0155965 | A1 | 6/2016 | Kusuura | |
| 2016/0239050 | A1* | 8/2016 | Kim | G06F 1/1652 |
| 2016/0324014 | A1* | 11/2016 | Lee | H05K 1/028 |
| 2016/0374228 | A1* | 12/2016 | Park | G09F 9/301 |
| 2016/0381814 | A1* | 12/2016 | Wang | H05K 7/1401 |
| | | | | 361/807 |
| 2017/0060183 | A1* | 3/2017 | Zhang | G06F 1/1615 |
| 2017/0196102 | A1* | 7/2017 | Shin | G06F 1/1652 |
| 2017/0222178 | A1* | 8/2017 | Kang | H10K 50/84 |
| 2017/0318689 | A1* | 11/2017 | Kim | H05K 5/0017 |
| 2017/0325342 | A1* | 11/2017 | Lee | H10K 50/84 |
| 2017/0325343 | A1* | 11/2017 | Seo | G03B 21/58 |
| 2017/0364122 | A1* | 12/2017 | Kim | G09F 9/301 |
| 2018/0188778 | A1* | 7/2018 | Shin | G06F 1/1652 |
| 2018/0359869 | A1* | 12/2018 | Kim | H05K 5/0217 |
| 2019/0182947 | A1* | 6/2019 | Xiang | H05K 1/028 |

FOREIGN PATENT DOCUMENTS

| | | |
|---|---|---|
| KR | 10-2017-0017157 A | 2/2017 |
| KR | 10-2017-0062327 A | 6/2017 |
| KR | 10-2017-0126069 A | 11/2017 |
| KR | 20-0487368 Y1 | 9/2018 |
| KR | 10-2018-0135704 A | 12/2018 |

* cited by examiner

FIG. 4
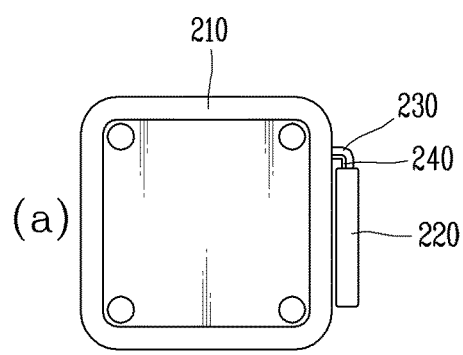
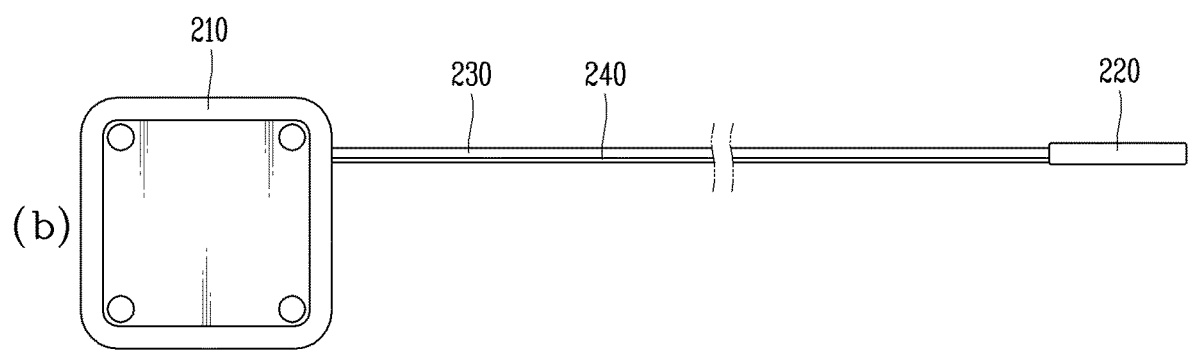

FLEXIBLE DISPLAY APPARATUS

CROSS REFERENCE TO RELATED APPLICATIONS

This application is the National Stage filing under 35 U.S.C. 371 of International Application No. PCT/KR2019/004306 filed on Apr. 10, 2019, which is hereby expressly incorporated by reference into the present application.

TECHNICAL FIELD

The present disclosure relates to a flexible display apparatus (or device) having a flexible display capable of being deformed by an external force.

BACKGROUND ART

Terminals may be classified into mobile/portable terminals and stationary terminals according to their mobility. Furthermore, mobile terminals may be divided into hand-held terminals and vehicle mounted terminals according to whether or not it can be directly carried by a user.

The functions of mobile terminals have been diversified. For example, the functions may include data and voice communication, photographing and video shooting through a camera, voice recording, playing a music file through a speaker system, and displaying an image or video on a display. Some terminals further include an electronic game play function or perform a multimedia player function. In particular, in recent years, mobile terminals may receive multicast signals that provide visual content such as broadcast, video or television programs.

As it becomes multifunctional in recent years, such a terminal is allowed to capture still images or moving images, play music or video files, play games, receive broadcast and the like, so as to be implemented as an integrated multimedia player. Furthermore, in order to support and enhance the functions of the terminal, the improvement of structural or software elements of the terminal may be taken into consideration.

In addition, mobile terminals are evolving into various types of designs, and efforts are being made to develop new types of mobile terminals to meet the needs of users who want newer and more diverse designs. New designs may also include structural changes and improvements for the user to more conveniently use the mobile terminal. For the structural changes and improvements, a mobile terminal in which at least part of a display can be bent or warped have attracted attention.

In recent years, as a flexible display capable of being bent has been developed, studies for applying the flexible display to a mobile terminal have been carried out. In order to implement a screen using a flexible display, the display must be smoothly unrolled or rolled, and there is a problem in that an internal structure of the mobile terminal must be complicated. Specifically, various considerations on a structure and an operation method such as how to support a rear surface of the flexible display and how to implement the rolling and unrolling of the display are required.

SUMMARY

An aspect of the present disclosure is to provide a structure of a flexible display apparatus with improved convenience and portability by allowing a display to be withdrawn from or inserted into an inside of a body.

Another aspect of the present disclosure is to provide a structure of a flexible display apparatus in which a flexible display can be effectively rolled or unrolled according to a user's use.

Yet still another aspect of the present disclosure is to provide a structure of a mobile terminal capable of reducing an external force applied to the flexible display even when a shape of the display is deformed while the display is rolled along the body.

In order to achieve the foregoing objectives of the present disclosure, a flexible display apparatus according to the present disclosure may include a first body; a flexible display configured to be inserted into or withdrawn from the first body while being deformed by an external force; a second body coupled to one end of the flexible display; and a rear plate coupled to a rear surface portion of the flexible display to be deformed together with the flexible display.

According to an example of the present disclosure, the flexible display may be deformed so as to be rolled while being inserted into the first body, and may be deformed so as to be unrolled while being withdrawn from the first body.

According to an example of the present disclosure, the flexible display may be configured to allow a region exposed to the outside to be extended while being withdrawn from an inside of the first body, and configured to allow the region exposed to the outside to be reduced while being rolled into the first body.

According to an example of the present disclosure, a distance between the first body and the second body may vary according to the rolled and unrolled state of the flexible display.

According to an example of the present disclosure, as the flexible display is switched to a unrolled state, an area exposed to the outside may be increased.

According to an example of the present disclosure, the first body may include a main cover member disposed in a polygonal pillar shape with both ends open and a storage space disposed therein; a side cover member configured to cover both sides of the main cover member; and a rotation member configured to be rotatable at an inner side of the main cover member while supporting one end of the rear plate.

According to an example of the present disclosure, flange parts configured to protrude in a radial direction may be disposed at both ends of the rotation member, respectively.

According to an example of the present disclosure, support covers may be coupled to both sides of the rotation member, respectively.

According to an example of the present disclosure, an elastic member may be provided at an inner side of the support cover, and the elastic member may have one end fixed to a support shaft formed through the support cover, so as to provide an elastic force for supporting the rotation member.

According to an example of the present disclosure, in the rotation member, a rear plate fixing groove may be disposed along an extension direction of the rotation member, and a bent end portion of the rear plate may be provided to be inserted thereinto.

According to an example of the present disclosure, a display movement hole cut with a predetermined width may be disposed on one side of the main cover member to allow the insertion or withdrawal of the flexible display.

According to an example of the present disclosure, the flexible display apparatus may further include a sub display provided to cover an outer surface of the any side cover member, wherein the sub display may be configured with a screen for providing information for a user.

According to an example of the present disclosure, the flexible display may be configured to be coupled to the rear plate, and configured to be rolled along an outer surface of the rotation member together with the rear plate.

According to an example of the present disclosure, the second body may include a first member and a second member configured to be coupled to each other in contact with each other, and when the flexible display is completely inserted, the first member may be positioned to face outward, and the second member may be positioned in contact with an outer surface of the first body.

According to an example of the present disclosure, a first magnet may be provided on one side of the first body, and a second magnet may be provided on one side of the second body, and when the flexible display is rolled into the first body, the first magnet and the second magnet are positioned in close contact with each other to allow the second body to be fixed to the first body.

According to an example of the present disclosure, a support member configured to rotate toward a front portion thereof, and disposed to support the flexible display withdrawn to the outside may be mounted on one side surface of the first member.

According to an example of the present disclosure, the second body may further include electronic components provided in an inner space defined by the first member and the second member.

The effects of the present disclosure obtained through the foregoing solutions are as follows.

With a flexible display apparatus having the foregoing structure, a flexible display may be withdrawn from an inside of a first body to be unrolled, or inserted into an inside the first body to be rolled, thereby further improving user's convenience and portability.

Furthermore, the flexible display may be rolled or unrolled along an outer surface of a rotation member inside the first body, and the flexible display may be effectively fixed through an elastic member provided at an inner side of a support cover.

In addition, since the flexible display may have a structure that is rolled together with a rear plate coupled to a rear surface portion thereof, thereby minimizing an external force that can be applied to the display even when a shape of the display is deformed.

Moreover, when the flexible display is rolled into the first body through magnets provided in the first body and a second body, a state in which the second body is fixed to the second body may be maintained, thereby further improving the user's portability.

(a) of FIG. 4 is a side view showing a relationship between the first body and a second body when the flexible display is inserted into the first body.

(b) of FIG. 4 is a side view showing a shape when the flexible display is withdrawn from the first body.

Figure 5:
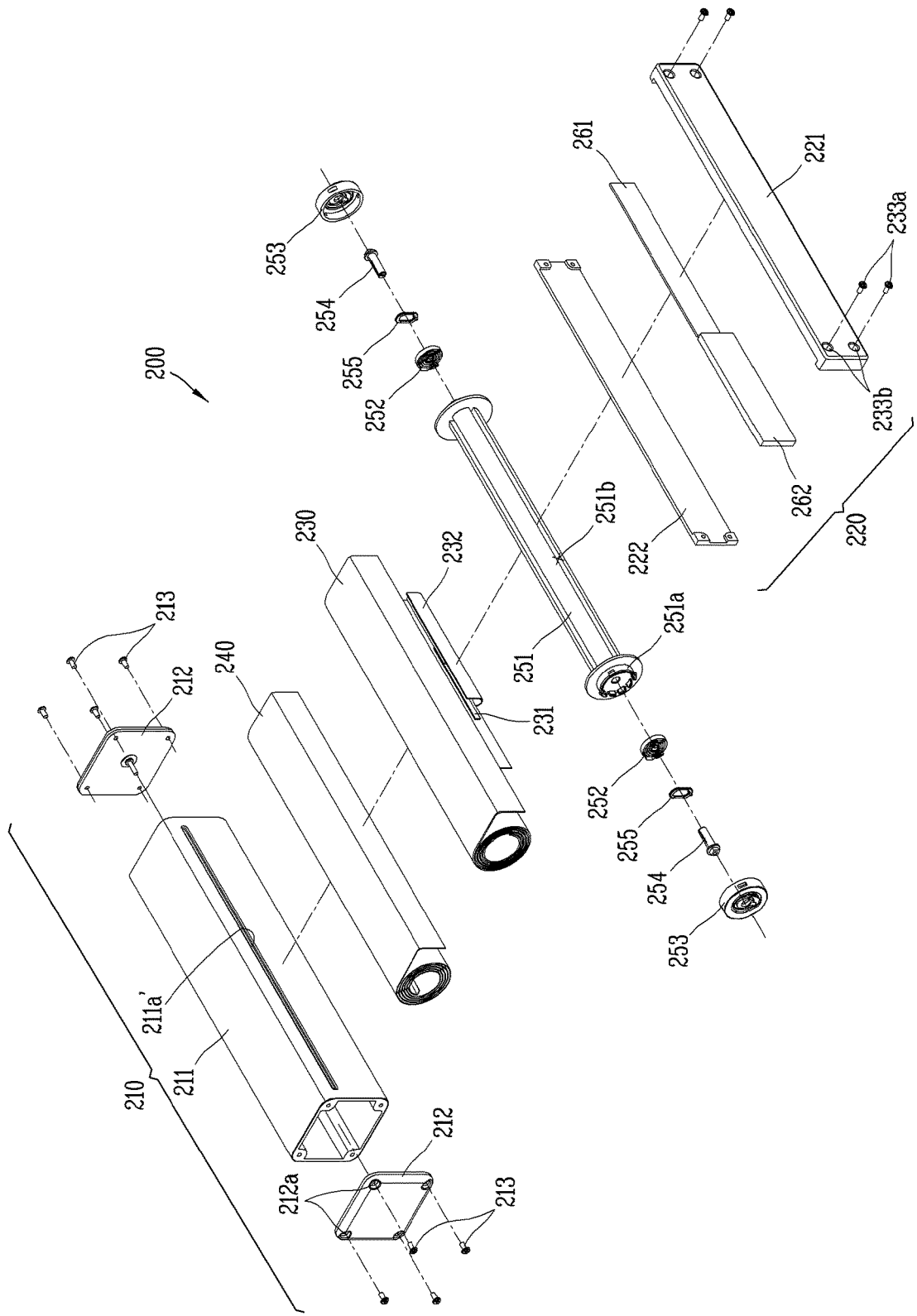

FIG. 5 is an exploded perspective view of a flexible display apparatus according to the present disclosure.

Figure 6:
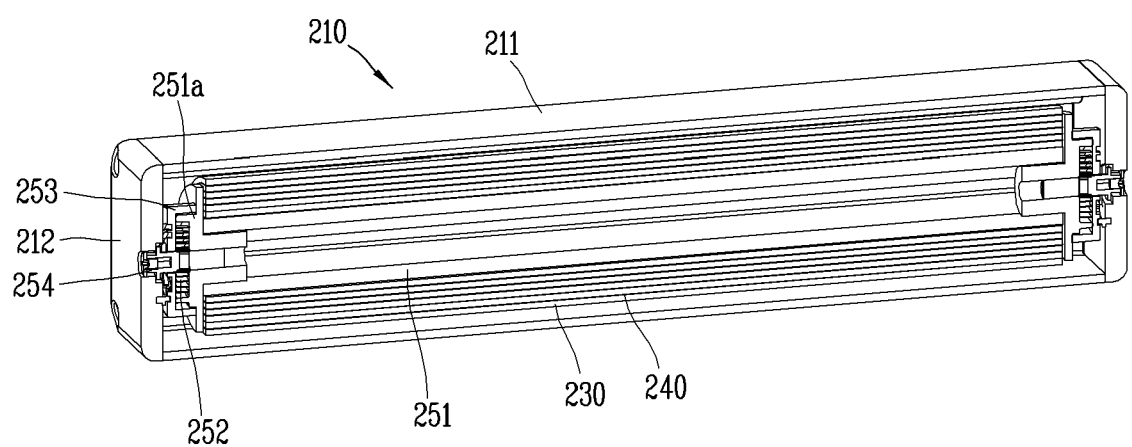

FIG. 6 is a cross-sectional view in which the first body is cut in a longitudinal direction.

Figure 7A:
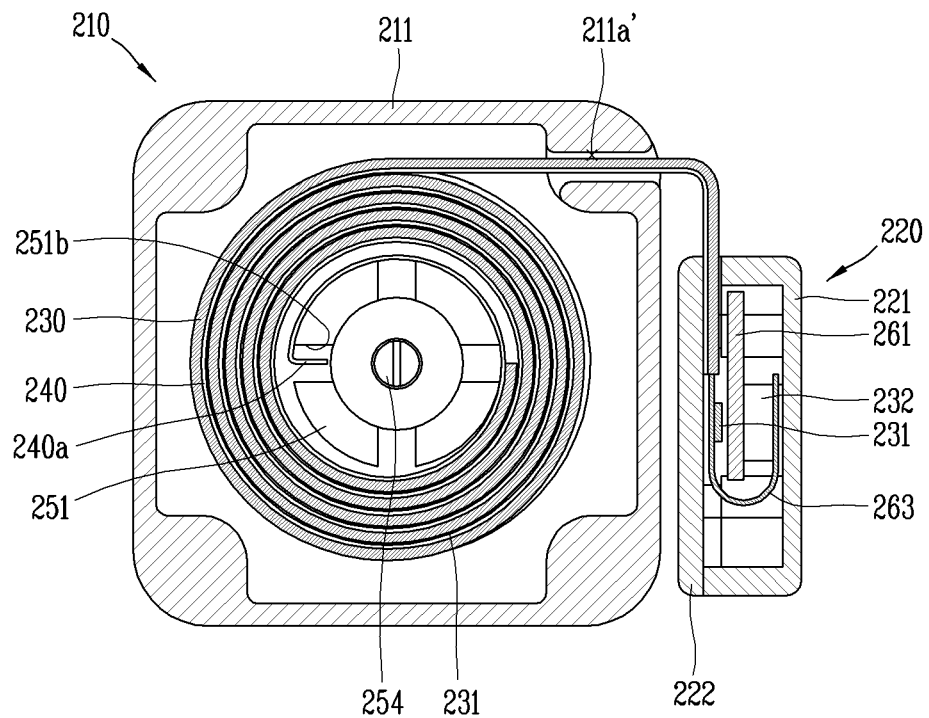

FIG. 7A is a longitudinal cross-sectional view of the flexible display apparatus according to the present disclosure.

Figure 7B:
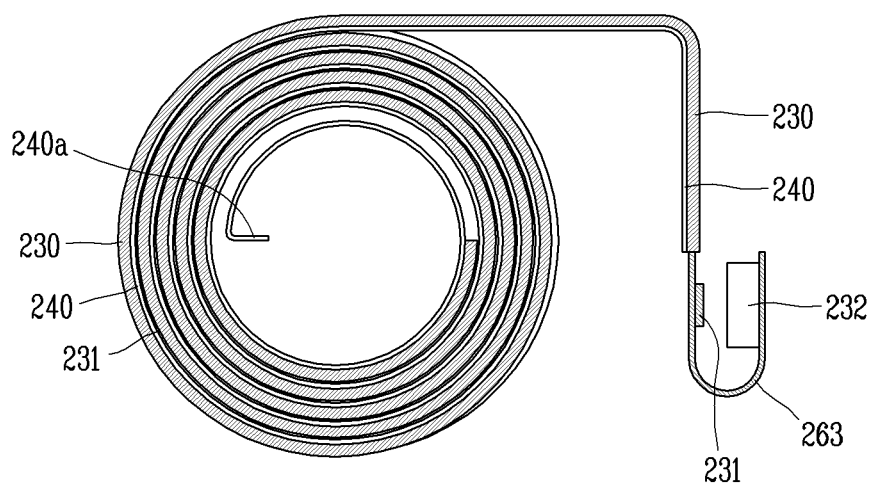

FIG. 7B is a conceptual view showing a shape of the flexible display and a rear plate supporting the same.

Figure 8A:
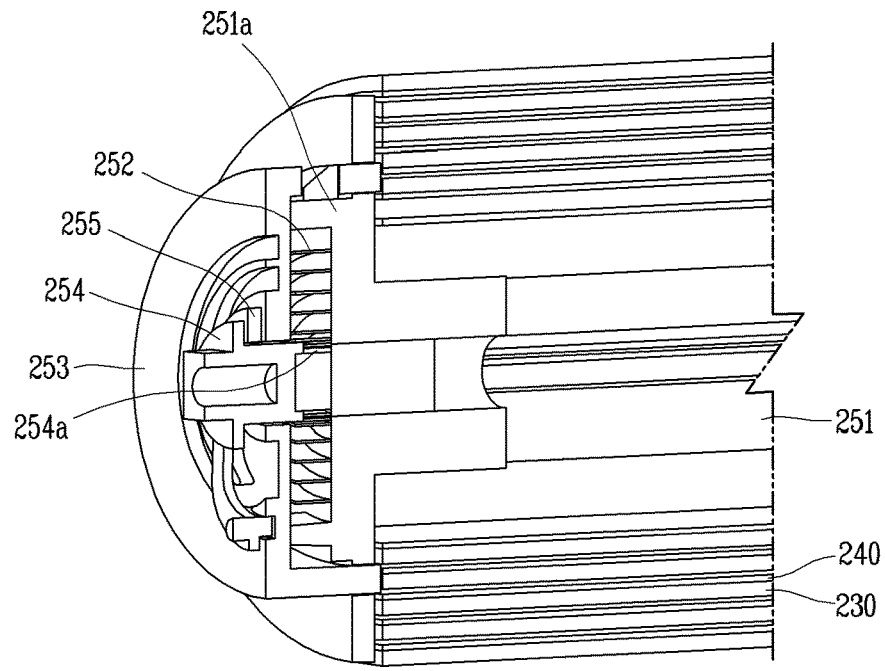
Figure 8B:
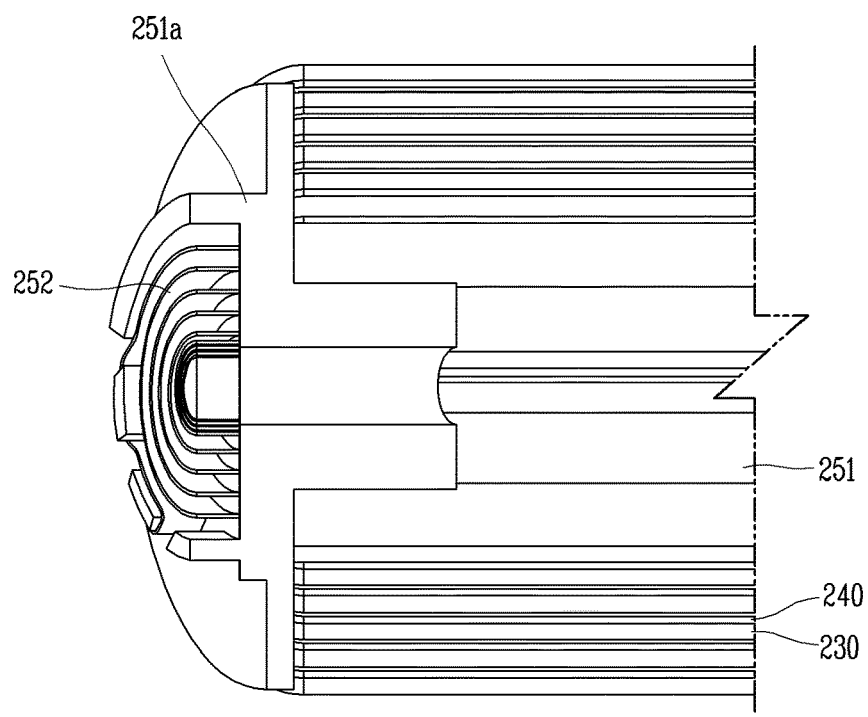

FIGS. 8A and 8B are partially enlarged views showing a part of the flexible display in a rolled state.

Figure 9A:
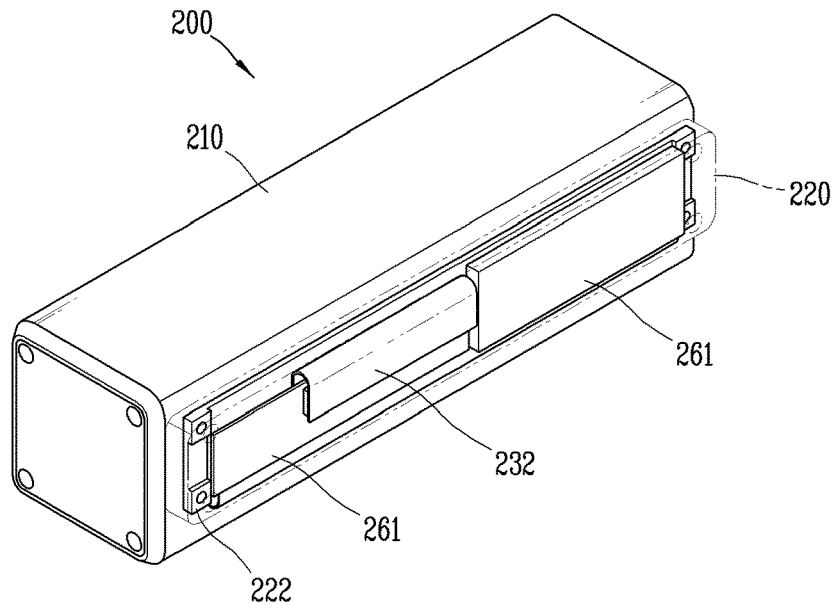

FIG. 9A is a conceptual view showing an inner shape of the second body while the first body and the second body are in close contact with each other.

Figure 9B:
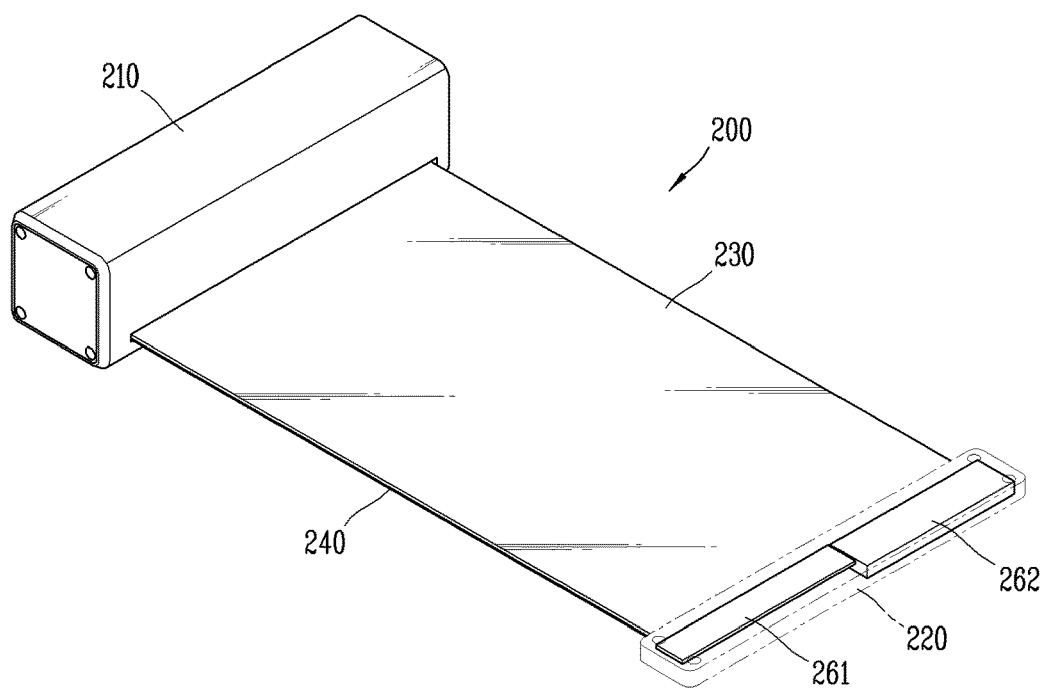

FIG. 9B is a conceptual view showing an inner shape of the second body while the display is unrolled.

Figure 10:
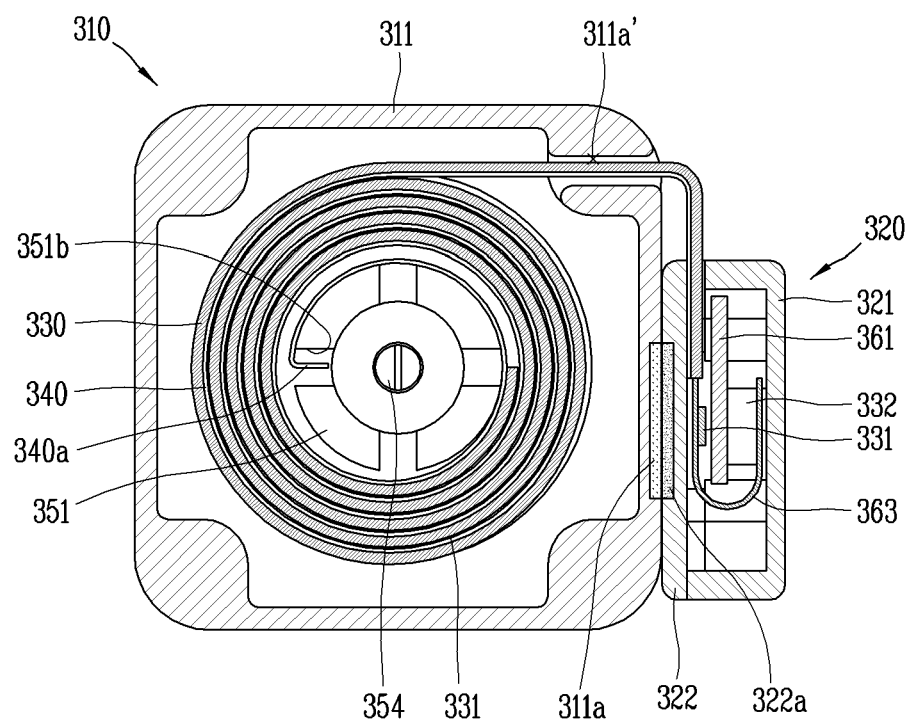

FIG. 10 is a cross-sectional view showing an inner shape of the flexible display apparatus according to another embodiment of the present disclosure.

Figure 11:
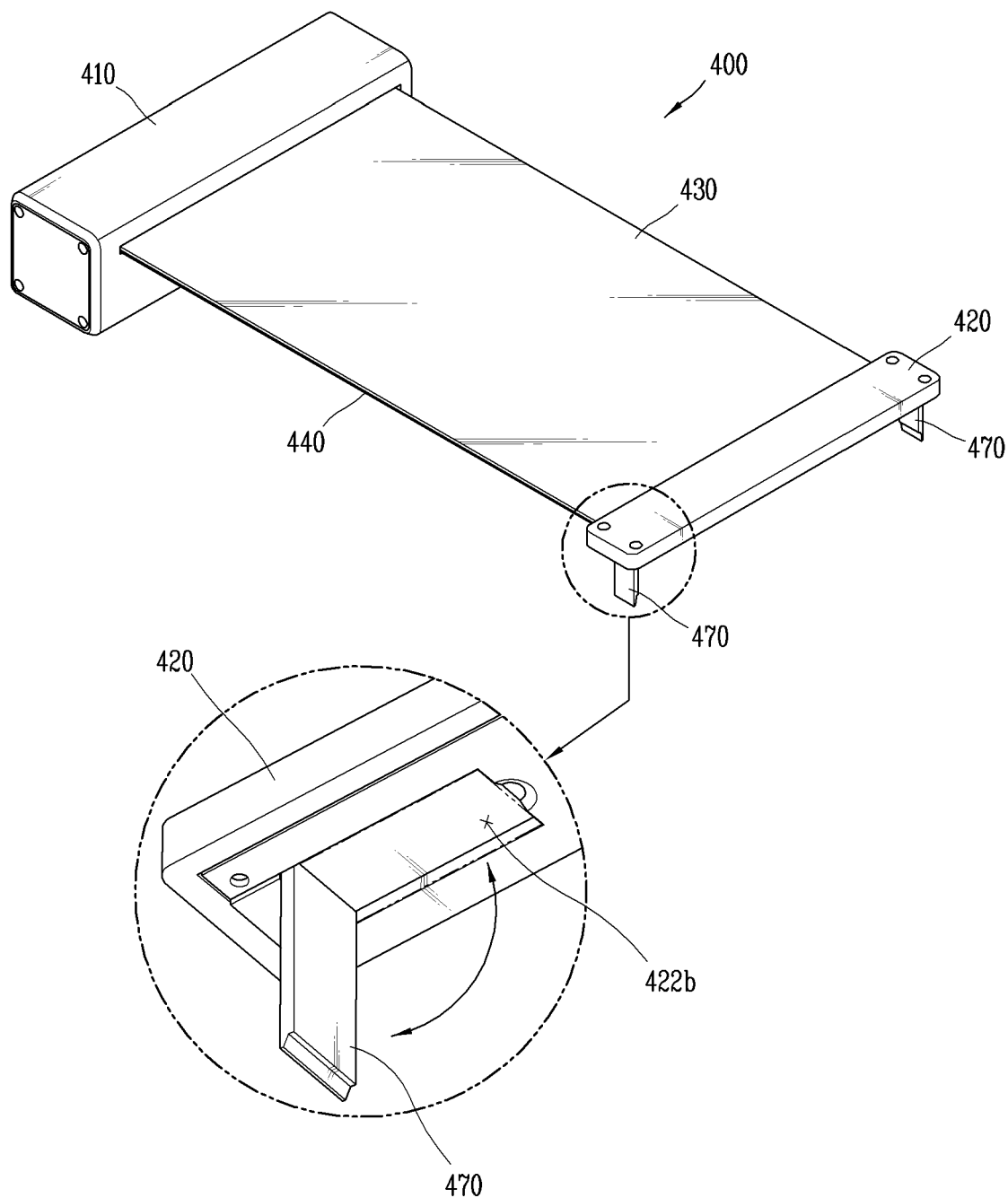

FIG. 11 is a conceptual view showing a shape in which support members are provided in the second body according to still another embodiment of the present disclosure.

Figure 12:
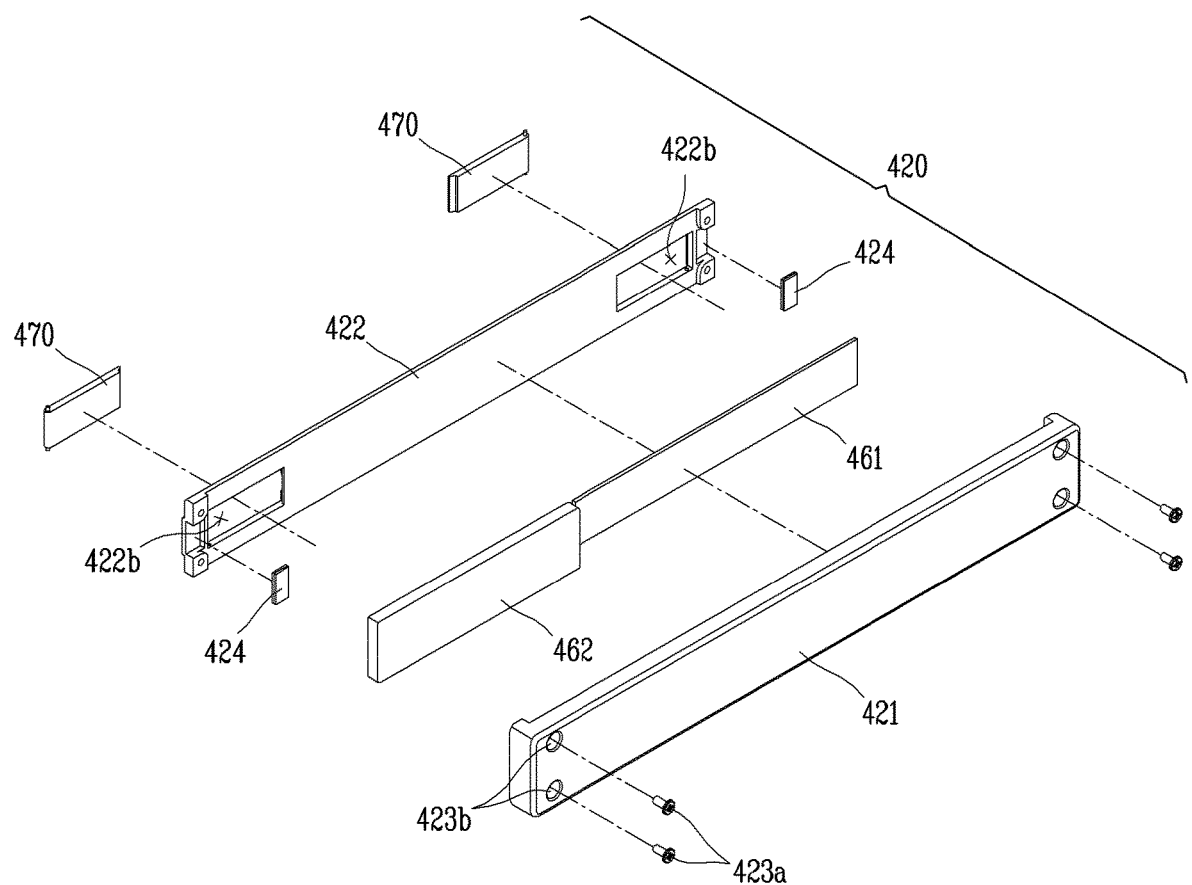

FIG. 12 is an exploded perspective view of the second body in FIG. 11.

Figure 13:
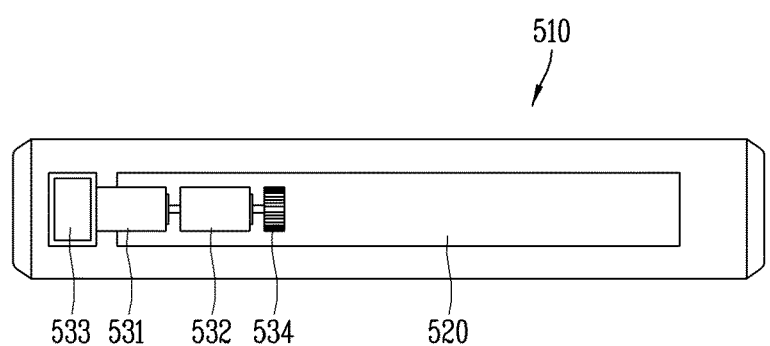

FIG. 13 is a cross-sectional view showing an inner shape of the flexible display apparatus to perform the driving of the first body according to yet still another embodiment of the present disclosure.

Figure 14:
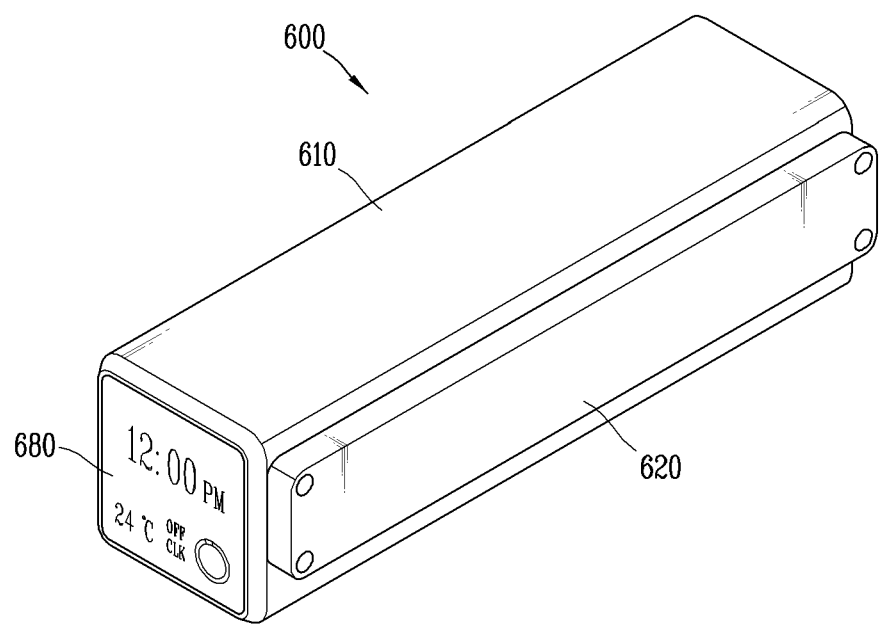

FIG. 14 is a perspective view of the flexible display apparatus according to still yet another embodiment of the present disclosure.

DETAILED DESCRIPTION

Hereinafter, preferred embodiments of the present disclosure will be described in detail with reference to the accompanying drawings, and the same or similar elements are designated with the same numeral references and their redundant description will be omitted. A suffix "module" and "unit" used for constituent elements disclosed in the following description is merely intended for easy description of the specification, and the suffix itself does not give any special meaning or function. In describing the present disclosure, moreover, the detailed description will be omitted when a specific description for publicly known technologies to which the disclosure pertains is judged to obscure the gist of the present disclosure. The accompanying drawings are used to help easily understand the technical idea of the present disclosure and it should be understood that the idea of the present disclosure is not limited by the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. On the contrary, in case where an element is "directly connected" or "directly linked" to another element, it should be understood that any other element is not existed therebetween.

A singular representation may include a plural representation as far as it represents a definitely different meaning from the context.

Terms "include" or "has" used herein should be understood that they are intended to indicate the existence of a feature, a number, a step, a constituent element, a component or a combination thereof disclosed in the specification, and it may also be understood that the existence or additional possibility of one or more other features, numbers, steps, constituent elements, components or combinations thereof are not excluded in advance.

Display apparatuses described herein may include cellular phones, smart phones, laptop computers, digital broadcasting terminals, personal digital assistants (PDAs), portable multimedia players (PMPs), navigators, slate PCs, tablet PCs, ultrabooks, wearable devices (for example, smart watches, smart glasses, head mounted displays (HMDs)), and the like.

However, it may be easily understood by those skilled in the art that the configuration according to the exemplary embodiments of this specification can also be applied to stationary terminals such as digital TV, desktop computers, digital signages, and the like, excluding a case of being applicable only to the mobile terminals. Hereinafter, for convenience of description, in the present specification, a mobile terminal will be described as an example of a flexible display apparatus.

Figure 1:
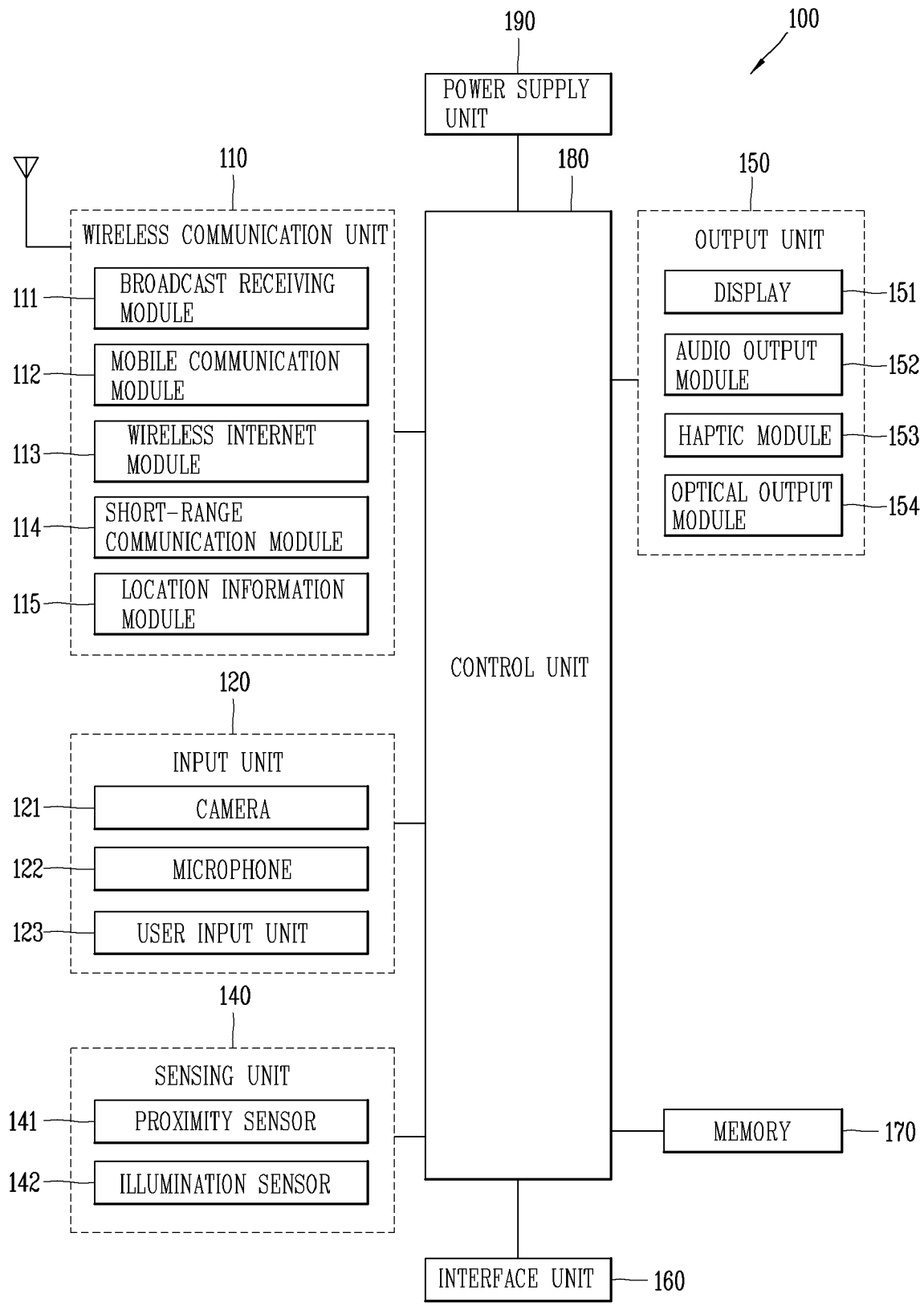
FIG. 1 is a block diagram for explaining a mobile terminal associated with the present disclosure.

FIG. 1 is a block diagram for explaining a mobile terminal associated with the present disclosure.

The mobile terminal 100 may include components, such as a wireless communication unit 110, an input unit 120, a sensing unit 140, an output unit 150, an interface unit 160, a memory 170, a controller 180, a power supply unit 190 and the like. The components shown in FIG. 1 are not essential for implementing a mobile terminal, and thus the mobile terminal described herein may have more or fewer components than those listed above.

In more detail, the wireless communication unit 110 of those components may typically include one or more modules which permit wireless communications between the mobile terminal 100 and a wireless communication system, between the mobile terminal 100 and another mobile terminal 100, or between the mobile terminal 100 and an external server. In addition, the wireless communication unit 110 may include one or more modules that connect the mobile terminal 100 to one or more networks.

The wireless communication unit 110 may include at least one of a broadcast receiving module 111, a mobile communication module 112, a wireless Internet module 113, a short-range communication module 114, a location information module 115 and the like.

The input unit 120 may include a camera 121 for inputting an image signal, a microphone 122 or an audio input module for inputting an audio signal, or a user input unit 123 (e.g., a touch key, a push key (or a mechanical key), etc.) for allowing a user to input information. Audio data or image data collected by the input unit 120 may be analyzed and processed by a user's control command.

The sensing unit 140 may include at least one sensor which senses at least one of internal information of the mobile terminal, a surrounding environment of the mobile terminal and user information. For example, the sensing unit 140 may include a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, refer to the camera 121), a microphone 122, a battery gage, an environment sensor (for example, a barometer, a hygrometer, a thermometer, a radiation detection sensor, a thermal sensor, a gas sensor, etc.), and a chemical sensor (e.g., an electronic nose, a health care sensor, a biometric sensor, etc.). On the other hand, the mobile terminal disclosed herein may utilize information in such a manner of combining information sensed by at least two sensors of those sensors.

The output unit 150 may be configured to output an audio signal, a video signal or a tactile signal. The output unit 150 may include a display 151, an audio output module 152, a haptic module 153, an optical output unit 154 and the like. The display 151 may have an inter-layered structure or an integrated structure with a touch sensor so as to implement a touch screen. The touch screen may provide an output interface between the mobile terminal 100 and a user, as well as functioning as the user input unit 123 which provides an input interface between the mobile terminal 100 and the user.

The interface unit 160 may serve as an interface with various types of external devices connected with the mobile terminal 100. The interface unit 160, for example, may include wired or wireless headset ports, external power supply ports, wired or wireless data ports, memory card ports, ports for connecting a device having an identification module, audio input/output (I/O) ports, video I/O ports, earphone ports, or the like. The mobile terminal 100 may execute an appropriate control associated with a connected external device, in response to the external device being connected to the interface unit 160.

In addition, the memory 170 stores data that support various functions of the mobile terminal 100. The memory 170 is typically implemented to store data to support various functions or features of the mobile terminal 100. For instance, the memory 170 may be configured to store application programs executed in the mobile terminal 100, data or instructions for operations of the mobile terminal 100, and the like. At least some of those application programs may be downloaded from an external server via wireless communication. Some others of those application programs may be installed within the mobile terminal 100 at the time of being shipped for basic functions of the mobile terminal 100 (for example, receiving a call, placing a call, receiving a message, sending a message, etc.). On the other hand, the application programs may be stored in the memory 170, installed in the mobile terminal 100, and executed by the controller 180 to perform an operation (or a function) of the mobile terminal 100.

The controller 180 may typically control an overall operation of the mobile terminal 100 in addition to the operations associated with the application programs. The controller 180 may provide or process information or functions appropriate for a user in a manner of processing signals, data, information and the like, which are input or output by the aforementioned components, or activating the application programs stored in the memory 170.

Furthermore, the controller 180 may control at least part of the components illustrated in FIG. 1, in order to drive the application programs stored in the memory 170. In addition, the controller 180 may drive the application programs by combining at least two of the components included in the mobile terminal 100 for operation.

The power supply unit 190 may receive external power or internal power and supply appropriate power required for operating respective elements and components included in the mobile terminal 100 under the control of the controller 180. The power supply unit 190 may include a battery, and the battery may be an embedded battery or a replaceable battery.

At least part of those elements and components may be combined to implement operation and control of the mobile terminal or a control method of the mobile terminal according to various exemplary embodiments described herein. Furthermore, the operation and control or the control method of the mobile terminal may be implemented in the mobile terminal in such a manner of activating at least one application program stored in the memory 170.

Hereinafter, each aforementioned component will be described in more detail with reference to FIG. 1, prior to explaining various exemplary embodiments implemented by the mobile terminal 100 having the configuration.

First, the wireless communication unit 110 will be described. The broadcast receiving module 111 of the wireless communication unit 110 may receive a broadcast signal and/or broadcast associated information from an external broadcast managing entity via a broadcast channel. The broadcast channel may include a satellite channel and/or a terrestrial channel. At least two broadcast receiving modules 111 may be provided in the mobile terminal 100 to simultaneously receive at least two broadcast channels or switch the broadcast channels.

The broadcast management server may mean a server that generates and transmits a broadcast signal and/or broadcast associated information or a server that receives a previously generated broadcast signal and/or broadcast associated information and transmits to the mobile terminal 100. The broadcast signal may include a TV broadcast signal, a radio broadcast signal and a data broadcast signal as well as a broadcast signal in a form that a data broadcast signal is coupled to the TV or radio broadcast signal.

The broadcast signal may be encoded according to at least one of technical standards (or broadcasting methods, e.g., ISO, IEC, DVB, ATSC, etc.) for transmission and reception of digital broadcast signals. The broadcast receiving module 111 may receive the digital broadcast signals using a method appropriate for a technical specification defined in the technical standards.

The broadcast associated information may mean information regarding a broadcast channel, a broadcast program, a broadcast service provider, and the like. The broadcast associated information may also be provided through a mobile communication network. The broadcast associated information may be provided via a mobile communication network, and received by the mobile communication module 112.

The broadcast associated information may be implemented in various formats. For instance, broadcast associated information may include an Electronic Program Guide (EPG) of Digital Multimedia Broadcasting (DMB), an Electronic Service Guide (ESG) of Digital Video Broadcast-Handheld (DVB-H), and the like. Broadcast signals and/or broadcast associated information received via the broadcast receiving module 111 may be stored in a memory 160.

The mobile communication module 112 may transmit/receive wireless signals to/from at least one of network entities, for example, a base station, an external terminal, a server, and the like, on a mobile communication network, which is constructed according to technical standards or transmission methods for mobile communications (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), etc.)

Here, the wireless signals may include audio call signal, video (telephony) call signal, or various formats of data according to transmission/reception of text/multimedia messages.

The wireless Internet module 113 refers to a module for supporting wireless Internet access, and may be built-in or externally installed on the mobile terminal 100. The wireless Internet module 113 may transmit and/or receive wireless signals via communication networks according to wireless Internet technologies.

Examples of such wireless Internet access may include Wireless LAN (WLAN), Wireless-Fidelity (Wi-Fi), Wireless Fidelity Direct (Wi-Fi Direct), Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), LTE (Long Term Evolution), LTE-A (Long Term Evolution-Advanced), and the like. The wireless Internet module 113 may transmit/receive data according to at least one wireless Internet technology within a range including even Internet technologies which are not aforementioned.

From the perspective that the wireless Internet accesses according to Wibro, HSDPA, GSM, CDMA, WCDMA, LTE, LTE-A and the like are executed via a mobile communication network, the wireless Internet module 113 which performs the wireless Internet access via the mobile communication network may be understood as a type of the mobile communication module 112.

The short-range communication module 114 denotes a module for short-range communications. Suitable technologies for implementing the short-range communications may include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, and the like. The short-range communication module 114 may support wireless communications between the mobile terminal 100 and a wireless communication system, between the mobile terminal 100 and another mobile terminal 100, or between the mobile terminal and a network where another mobile terminal 100 (or an external server) is located, via wireless personal area networks. The short-range communication module 114 denotes a module for short-range communications.

Here, the another mobile terminal 100 may be a wearable device, for example, a smart watch, smart glasses or a head mounted display (HMD), which is able to exchange data with the mobile terminal 100 (or to link data with the mobile terminal 100). The short-range communication module 114 may sense (recognize) a wearable device, which is able to communicate with the mobile terminal), near the mobile terminal 100. In addition, when the sensed wearable device is a device which is authenticated to communicate with the mobile terminal 100 according to the present disclosure, the controller 180 may transmit at least part of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a WiFi module, or both. For example, when the mobile terminal uses the GPS module, a position of the mobile terminal may be acquired using a signal sent from a GPS satellite. As another example, when the mobile terminal uses the Wi-Fi module, a position of the mobile terminal may be acquired based on information associated with a wireless access point (AP) which transmits or receives a wireless signal to or from the Wi-Fi module. According to the need, the location information module 115 may perform any function of the other modules of the wireless communication unit 110 to obtain data on the location of the mobile terminal. As a module used to acquire the location (or current location) of the mobile terminal, the location information module 115 may not be necessarily limited to a module for directly calculating or acquiring the location of the mobile terminal.

The input unit 120 may be configured to provide an audio or video signal (or information) input to the mobile terminal or information input by a user to the mobile terminal. For the input of the audio information, the mobile terminal 100 may include one or a plurality of cameras 121. The camera 121 processes an image frame, such as still picture or video, acquired by an image sensor in a video phone call or image capturing mode. The processed image frames may be displayed on the display 151 or stored in the memory 170. On the other hand, the plurality of cameras 121 disposed in the mobile terminal 100 may be arranged in a matrix configuration. By use of the cameras 121 having the matrix configuration, a plurality of image information having various angles or focal points may be input into the mobile terminal 100. As another example, the cameras 121 may be located in a stereoscopic arrangement to acquire left and right images for implementing a stereoscopic image.

The microphone 122 may process an external audio signal into electric audio data. The processed audio data may be utilized in various manners according to a function being executed in the mobile terminal 100 (or an application program being executed). On the other hand, the microphone 122 may include assorted noise removing algorithms to remove noise generated in the course of receiving the external audio signal.

The user input unit 123 may receive information input by a user. When information is input through the user input unit 123, the controller 180 may control an operation of the mobile terminal 100 to correspond to the input information. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

On the other hand, the sensing unit 140 may sense at least one of internal information of the mobile terminal, surrounding environment information of the mobile terminal and user information, and generate a sensing signal corresponding to it. The controller 180 may control an operation of the mobile terminal 100 or execute data processing, a function or an operation associated with an application program installed in the mobile terminal based on the sensing signal. Hereinafter, description will be given in more detail of representative sensors of various sensors which may be included in the sensing unit 140.

First, a proximity sensor 141 refers to a sensor to sense presence or absence of an object approaching to a surface to be sensed, or an object disposed near a surface to be sensed, by using an electromagnetic field or infrared rays without a mechanical contact. The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 may sense proximity of a pointer to the touch screen by changes of an electromagnetic field, which is responsive to an approach of an object with conductivity. In this case, the touch screen (touch sensor) may also be categorized as a proximity sensor.

On the other hand, for the sake of brief explanation, a behavior in which the pointer is positioned to be proximate onto the touch screen without contact will be referred to as "proximity touch," whereas a behavior in which the pointer substantially comes into contact with the touch screen will be referred to as "contact touch." For the position corresponding to the proximity touch of the pointer on the touch screen, such position will correspond to a position where the pointer faces perpendicular to the touch screen upon the proximity touch of the pointer. The proximity sensor 141 may sense proximity touch, and proximity touch patterns (e.g., distance, direction, speed, time, position, moving state, etc.). On the other hand, the controller 180 may process data (or information) corresponding to the proximity touches and the proximity touch patterns sensed by the proximity sensor 141, and output visual information corresponding to the process data on the touch screen. In addition, the controller 180 may control the mobile terminal 100 to execute different operations or process different data (or information) according to whether a touch with respect to the same point on the touch screen is either a proximity touch or a contact touch.

A touch sensor can sense a touch applied to the touch screen, such as display 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display 151 or a capacitance occurring from a specific part of the display 151, into electric input signals. The touch sensor may be configured to detect a position, an area where a touch object applying a touch onto the touch screen is touched on the touch sensor, a pressure at the time of touch, a capacitance at the time of touch, and the like. Here, the touch object body may be a finger, a touch pen or stylus pen, a pointer, or the like as an object through which a touch is applied to the touch sensor.

When a touch input is sensed by a touch sensor, corresponding signals may be transmitted to a touch controller. The touch controller may process the received signals, and then transmit corresponding data to the controller 180. Accordingly, the controller 180 may sense which region of the display 151 has been touched. Here, the touch controller may be a component separate from the controller 180 or the controller 180 itself.

On the other hand, the controller 180 may execute a different control or the same control according to a type of an object which touches the touch screen (or a touch key provided in addition to the touch screen). Whether to execute the different control or the same control according to the object which gives a touch input may be decided based on a current operating state of the mobile terminal 100 or a currently executed application program.

Meanwhile, the touch sensor and the proximity sensor may be executed individually or in combination, to sense various types of touches, such as a short (or tap) touch, a long touch, a multi-touch, a drag touch, a flick touch, a pinch-in touch, a pinch-out touch, a swipe touch, a hovering touch, and the like.

An ultrasonic sensor may be configured to recognize position information relating to a sensing object by using ultrasonic waves. Meanwhile, the controller 180 may calculate the location of a wave generating source through information sensed from the optical sensor and the plurality of ultrasonic sensors. Since light is much faster than ultrasonic waves, a time for which the light reaches the optical sensor may be much shorter than a time for which the ultrasonic wave reaches the ultrasonic sensor. The position of the wave generation source may be calculated using the fact. In more detail, the position of the wave generation source may be calculated by using a time difference from the time that the ultrasonic wave reaches based on the light as a reference signal.

The camera 121 constructing the input unit 120 may be a type of camera sensor. The camera sensor may include at least one of a photo sensor (or image sensor) and a laser sensor.

The camera 121 and the laser sensor may be combined with each other to detect a touch of the sensing object with respect to a 3D stereoscopic image. The photo sensor may be laminated on the display device. The photo sensor may be configured to scan a movement of the sensing object in proximity to the touch screen. In more detail, the photo sensor may include photo diodes and transistors at rows and columns to scan content placed on the photo sensor by using an electrical signal which changes according to the quantity of applied light. Namely, the photo sensor may calculate the coordinates of the sensing object according to variation of light to thus obtain position information of the sensing object.

The display 151 displays (outputs) information processed by the mobile terminal 100. For example, the display 151 may display execution screen information of an application program driven in the mobile terminal 100 or user interface (UI) and graphic user interface (GUI) information in response to the execution screen information.

Furthermore, the display 151 may also be implemented as a stereoscopic display for displaying stereoscopic images.

The stereoscopic display may employ a stereoscopic display scheme such as stereoscopic scheme (a glass scheme), an auto-stereoscopic scheme (glassless scheme), a projection scheme (holographic scheme), or the like.

The audio output unit 152 may output audio data received from the wireless communication unit 110 or stored in the memory 160 in a call signal reception mode, a call mode, a record mode, a voice recognition mode, a broadcast reception mode, and the like. Also, the audio output module 152 may also provide audible output signals associated with a particular function (e.g., a call signal reception sound, a message reception sound, etc.) carried out by the mobile terminal 100. The audio output module 152 may include a receiver, a speaker, a buzzer or the like.

A haptic module 153 may generate various tactile effects the that user may feel. A typical example of the tactile effect generated by the haptic module 153 may be vibration. The intensity, pattern and the like of vibration generated by the haptic module 153 may be controlled by a user's selection or the settings of the controller 180. For example, the haptic module 153 may output different vibrations in a combining manner or a sequential manner.

Besides vibration, the haptic module 153 may generate various other tactile effects, including an effect by stimulation such as a pin arrangement vertically moving with respect to a contact skin, a spray force or suction force of air through a jet orifice or a suction opening, a touch on the skin, a contact of an electrode, electrostatic force, etc., an effect by reproducing the sense of cold and warmth using an element that can absorb or generate heat, and the like.

The haptic module 153 may be configured to transmit tactile effects through a user's direct contact, or a user's muscular sense using a finger or a hand. Two or more haptic modules 153 may be provided according to the particular configuration of the mobile terminal 100.

An optical output unit 154 may output a signal for indicating an event generation using light of a light source. Examples of events generated in the mobile terminal 100 may include a message reception, a call signal reception, a missed call, an alarm, a schedule notice, an email reception, an information reception through an application, and the like.

A signal output by the optical output unit 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. A device having the identification module (hereinafter, an "identification device") may be fabricated in the form of a smart card. Accordingly, the identifying device may be connected with the terminal 100 via the interface unit 160.

Furthermore, when the mobile terminal 100 is connected with an external cradle, the interface unit 160 may serve as a passage to allow power from the cradle to be supplied to the mobile terminal 100 therethrough or may serve as a passage to allow various command signals input by the user from the cradle to be transferred to the mobile terminal therethrough. Such various command signals or power inputted from the cradle may operate as signals for recognizing that the mobile terminal 100 has accurately been mounted to the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include at least one type of storage medium including a Flash memory, a hard disk, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the mobile terminal 100 may be operated in relation to a web storage device that performs the storage function of the memory 170 over the Internet.

As aforementioned, the controller 180 may typically control the general operations of the mobile terminal 100. For example, the controller 180 may execute or release a locked state for restricting a user from inputting a control command with respect to applications when a state of the mobile terminal meets a preset condition.

Furthermore, the controller 180 may also perform controlling and processing associated with voice calls, data communications, video calls, and the like, or perform pattern recognition processing to recognize a handwriting input or a picture drawing input performed on the touch screen as characters or images, respectively. In addition, the controller 180 may control one or combination of those components in order to implement various exemplary embodiment disclosed herein on the mobile terminal 100.

The power supply unit 190 may receive external power or internal power and supply appropriate power required for operating respective elements and components included in the electronic device 100 under the control of the controller 180. The power supply unit 190 may include a battery, which is typically rechargeable or be detachably coupled to the terminal body for charging.

Furthermore, the power supply unit 190 may include a connection port. The connection port may be configured as one example of the interface unit 160 to which an external (re)charger for supplying power to recharge the battery is electrically connected.

As another example, the power supply unit 190 may be configured to recharge the battery in a wireless manner without use of the connection port. Here, the power supply unit 190 may receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable or its similar medium using, for example, software, hardware, or any combination thereof.

The display 151 displays (outputs) information processed by the mobile terminal 100. For example, the display 151 may display execution screen information of an application program driven in the mobile terminal 100 or user interface (UI) and graphic user interface (GUI) information in response to the execution screen information.

The display 151 may include at least one of a liquid crystal display (LCD), a thin film transistor-liquid crystal display (TFT-LCD), an organic light emitting diode (OLED), a flexible display, a 3-dimensional (3D) display, and an e-ink display.

The display 151 may be implemented in two or more in number according to a configured aspect of the mobile terminal 100. For instance, a plurality of the displays 151 may be arranged on one surface to be spaced apart from or integrated with each other, or may be arranged on different surfaces.

The display 151 may include a touch sensor which senses a touch onto the display so as to receive a control command in a touching manner. When a touch is input to the display 151, the touch sensor may be configured to sense this touch and the controller 180 may generate a control command corresponding to the touch. The content which is input in the touching manner may be a text or numerical value, or a menu item which can be indicated or designated in various modes.

The microphone 122 may be formed to receive the user's voice, other sounds, and the like. The microphone 122 may be provided at a plurality of places, and configured to receive stereo sounds.

The interface unit 160 may serve as a path allowing the mobile terminal 100 to exchange data with external devices. For example, the interface unit 160 may be at least one of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

At least one antenna for wireless communication may be disposed on the terminal body. The antenna may be installed in the terminal body or formed on the case. For example, the antenna constituting the broadcast receiving module 111 (refer to FIG. 1) may be configured to be retractable from the body of the mobile terminal. Otherwise, the antenna may be formed in a film type and attached to an inner surface of a housing, and a case containing a conductive material may be configured to function as an antenna.

A power supply unit 190 (refer to FIG. 1) for supplying power to the mobile terminal 100 may be disposed on the terminal body. The power supply unit 190 may include a batter 191 which is mounted in the terminal body or detachably coupled to an outside of the terminal body.

The battery 191 may receive power via a power source cable connected to the interface unit 160. Furthermore, the battery 191 may be (re)chargeable in a wireless manner using a wireless charger. The wireless charging may be implemented by magnetic induction or electromagnetic resonance.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may link with the display 151 to extend the function of the mobile terminal 100. Another example of the accessory may be a touch pen for assisting or extending a touch input onto a touch screen.

Figure 2:
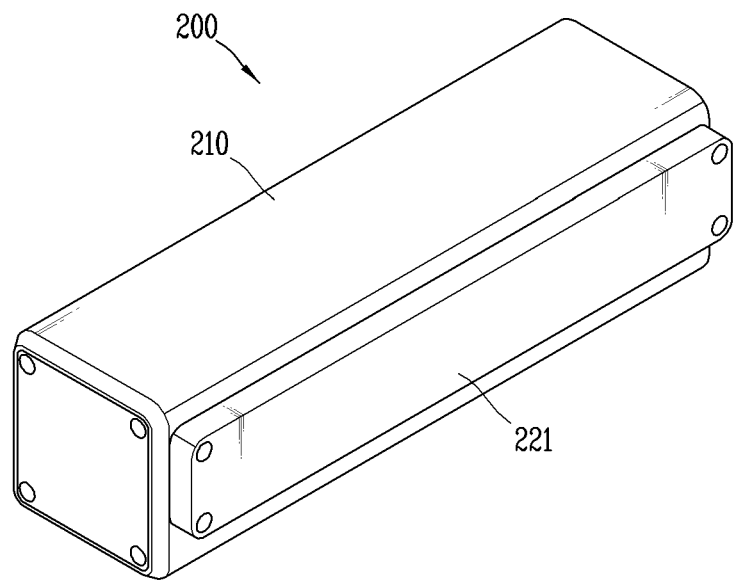
FIG. 2 is a perspective view showing a shape in which a flexible display is inserted into a first body to be rolled.
Figure 3:
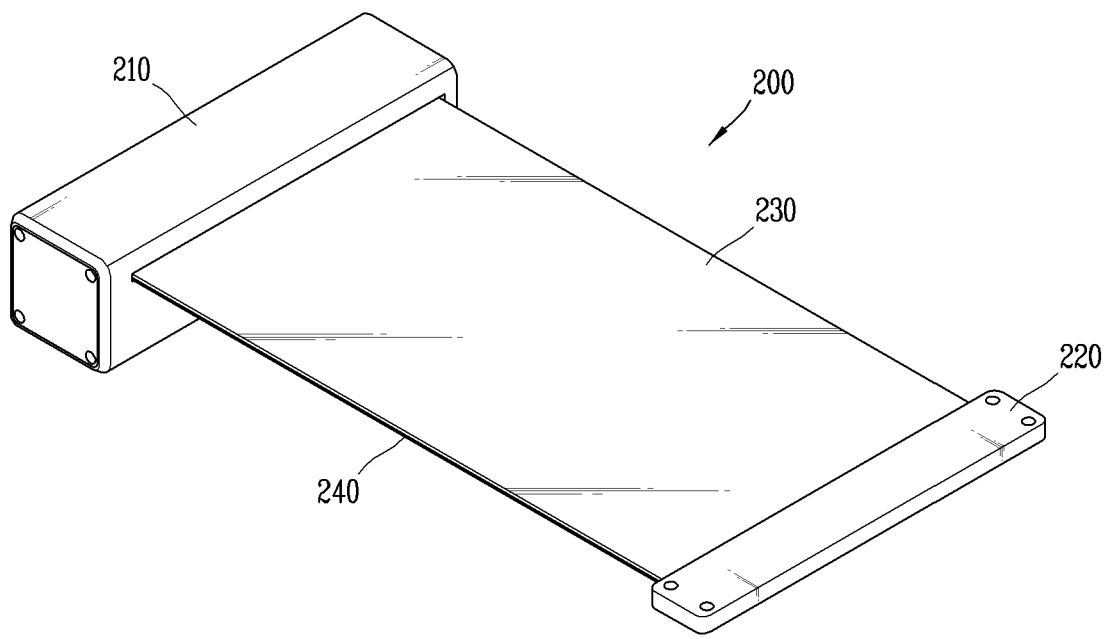
FIG. 3 is a perspective view showing a shape in which the flexible display is withdrawn from the first body to be unrolled.

FIG. 2 is a perspective view showing a shape in which a flexible display 230 is inserted into a first body 210 to be rolled, and FIG. 3 is a perspective view showing a shape in which the flexible display 230 is withdrawn from the first body 210 to be unrolled.

A flexible display apparatus (or device) 200 may be understood as a type of the above-described mobile terminal, and in the present specification, it will be referred to as a flexible display apparatus for convenience.

The flexible display apparatus 200 according to an embodiment of the present disclosure may include a first body 210 and a second body 220. Furthermore, the flexible display apparatus 200 may include a flexible display 230 configured to be deformed by an external force.

Since a rear plate 240 is attached and coupled to a rear surface portion of the flexible display 230, the flexible display 230 may be rolled into the first body 210 together with the rear plate 240, or withdrawn from the first body 210.

The flexible display 230 may have both sides fixed to the first body 210 and the second body 220, respectively, and may be configured to be deformed according to the movement of the first body 210 and the second body 220.

The flexible display apparatus 200 according to the present disclosure may implement a first state in which the flexible display 230 is inserted into the first body 210 to be rolled, and a second state in which the flexible display 230 is withdrawn from the first body 210 to be unrolled, respectively, as shown in FIG. 2.

The flexible display apparatus 200 may display information processed using the flexible display 230 having a flexible characteristic that is deformable by an external force.

Here, deformation may be at least one of bending, warping, folding, twisting, and curling of the display module, and may denote a characteristic in which the flexible display 230 is rolled into the body 210. Such a deformable display module may be referred to as a "flexible display". The flexible display 230 may include a general flexible display, an e-paper, or a combination thereof.

The general flexible display denotes a light, non-fragile display, which still exhibits characteristics of the conventional flat panel display and is fabricated on a flexible substrate which can be curved, bent, folded, twisted or rolled.

Furthermore, the e-paper is a display technology employing the characteristic of a general ink, and is different from the conventional flat panel display in view of using reflected light. The e-paper may change information by using a twist ball or an electrophoresis using a capsule.

The flexible display apparatus 200 according to the present disclosure may implement a state in which the flexible display 230 is deformed by an external force (e.g., a state of being rolled in the first body with a finite radius of curvature, a first state, see FIG. 2) and a state in which the flexible display 230 is unrolled (e.g., a state having an infinite radius of curvature, a second state, see FIG. 3).

The user may utilize the flexible display 230 in an unrolled second state, and may accommodate the flexible display 230 in a state of being rolled in the first body 210. Accordingly, the present disclosure has an advantage of being easily accommodated for storage along with portability.

Furthermore, information displayed on the flexible display 230 may include output visual information. The visual information may be implemented in such a manner that the light emission of each sub-pixel disposed in a matrix configuration is controlled independently. The sub-pixel denotes an elementary unit for implementing a single color.

On the other hand, the flexible display 230 may implement a flexible touch screen using a touch sensor in combination with a touch sensor. When a touch is made with respect to the flexible touch screen, the controller 180 (see FIG. 1A) may execute control corresponding to the touch input. The flexible touch screen may be configured to sense a touch input even in the second state as well as in the first state.

On the other hand, the flexible display apparatus 200 according to a modified example may include a deformation sensing element capable of sensing the deformation of the flexible display 230. The deformation sensing element may be included in the sensing unit 140 (see FIG. 1A).

The deformation sensing element may be provided in the flexible display 230 or the first and second the bodies 210, 220 to sense information related to deformation of the flexible display 230.

Here, the information related to the deformation of the flexible display 230 may be a deformed direction, a deformed degree, a deformed position, a deformed time, an acceleration that the deformed flexible display 230 is restored, and the like, and may denote various information that can be sensed due to the bending of the flexible display 239.

Furthermore, the controller 180 may change information displayed on the flexible display 230 or generate a control signal for controlling a function of the flexible display 200, based on the information related to the deformation of the flexible display 151 sensed by the deformation sensing element.

Furthermore, the state deformation of the flexible display 230 may not be necessarily limited to an external force. For example, the flexible display 230 may be deformed from the first state to the second state by a command of a user or an application, and has a structure capable of being deformed from the second state to the first state.

(a) of FIG. 4 is a side view showing a relationship between the first body 210 and the second body 220 when the flexible display 230 is inserted into the first body 210, and (b) of FIG. 4 is a side view showing a shape when the flexible display is withdrawn from the first body 210.

As shown in (a) of FIG. 4, in the first state, the flexible display apparatus 200 may be configured such that at least part of the flexible display 230 is rolled while the flexible display 230 is inserted into the first body 210. The flexible display 230 may be inserted into the first body 210 while being deformed to a flat state (or a less bent state) or a more bent state. When the flexible display 230 of the flexible display apparatus 200 is completely inserted into the first body 210, part of the flexible display 230 exposed to the outside may bent, and the first body 210 and the second body 220 will be in close contact with each other to be overlapped.

In addition, as shown in (b) of FIG. 4, the flexible display 230 may have a structure capable of implementing the second state in which the flexible display 230 is unrolled together with the second body 220 while the flexible display 230 is withdrawn from an inside of the first body 210. In this case, the flexible display 230 will be exposed to the outside. In the flexible display 230 in the second state, the first body 210 and the second body 220 are spaced farthest apart from each other, and the user may freely utilize the flexible display 230 exposed to the outside.

The first body 210 of the flexible display apparatus 200 may support one region of the flexible display 230, and the second body 220 may support another region of the flexible display 230. Furthermore, a plurality of electronic components for driving the flexible display apparatus 200 may be mounted on at least one region of the first and second bodies 210 and 220.

In other words, as shown in FIG. 4, in the flexible display apparatus 200, a distance between the first body 210 and the second body 220 varies according to the rolled and unrolled state of the flexible display 230.

As changed from the first state in which the flexible display 230 is rolled into the first body 210 to the second state in which the flexible display 230 is unrolled, an area of the display exposed to the outside may increase.

In the flexible display apparatus 200, in the second state in which the flexible display 230 is unrolled, the first body 210 and the second body 220 are disposed with the flexible display 230 interposed therebetween.

In the second state in which the flexible display 230 is unrolled, the user may utilize it to perform various tasks such as an e-book and web surfing. The user will be able to more conveniently utilize a large screen using the extended flexible display 230.

FIG. 5 is an exploded perspective view of the flexible display apparatus 200 according to the present disclosure.

The flexible display apparatus 200 may include a first body 210, a second body 220, and a flexible display 230.

The first body 210 serves to store a rolled flexible display 230 therein, and may include a main cover member 211, side cover members 212, and a rotation member 251.

The main cover member 211 may have a polygonal pillar shape with both ends open. For example, as shown in FIG. 5, the main cover member 211 may have a rectangular pillar shape. A storage space may be defined in the main cover member 211 to store the rolled flexible display 230 therein.

At one side of the main cover member 211, a display movement hole 211a' may be disposed along an extension direction of the main cover member 211 to allow the flexible display 230 to be inserted thereinto and withdrawn therefrom.

A width of the display movement hole 211a' is made larger than a sum of thicknesses of the flexible display 230 and the rear plate 240, thereby preferably allowing the insertion and withdrawal of the flexible display 230 to be smoothly performed. The width of the display movement hole 211a' may be defined to have a length similar to the width (length in a vertical direction) of the flexible display 230.

The side cover members 212 are configured to cover both sides of the main cover member 211, and serve to limit the rotation member 251 provided inside the main cover member 211, and the flexible display 230 configured to be rolled along an outer surface of the rotation member 251 from being exposed to the outside.

The side cover members 212 may be fixed to both sides of the main cover member 211 through screw fastening. The side cover members 212 may be fixed in such a manner that screws 213 are fastened to screw fastening portions 212a disposed on both sides of the main cover member 211.

The rotation member 251 may have a cylindrical shape, and may be rotatable inside the main cover member 211.

The rotation member 251 is positioned in an inner space of the main cover member 211 to serve to roll the flexible display 230.

A fixing groove of the rear plate 240 is disposed on an outer surface of the rotation member 251 along an extension direction of the rotation member 251, and one bent end of the rear plate 240 is inserted into and then fixed to the fixing groove of the rear plate 240. The bent end portion of the rear plate 240 may be provided to be inserted into the rear plate fixing groove 251b. Accordingly, when the rotation member 251 rotates inside the first body 210, the flexible display 230 and the rear plate 240 can be rolled along an outer surface of the rotation member 251 while a bending portion 240a of the rear plate 240 is fixed to the rear plate fixing groove 251b.

Flange parts protruding in a radial direction may be disposed at both ends of the rotation member 251. The flange parts serve to guide the rolling of the flexible display 230 rolled along the outer surface of the rotation member 251 and prevent the flexible display 230 from being released to the outside to support it.

Accordingly, when the rotation member 251 rotates in one direction, the flexible display 230 can be rolled along the outer surface of the rotation member 251 without being released to the outside.

Support covers 253 may be provided to be inserted into both sides of the rotation member 251. An elastic member 252 may be provided at an inner side of the support cover 253. Here, the elastic member 252 may be provided such that one end thereof is fixed to a support shaft 254 provided to pass through the support cover 253. Here, the elastic member 252 may denote a spiral spring with a coil shape rolled on a plane in a long and thin strip shaped steel having a constant cross section.

The elastic member 252 serves to provide an elastic force for supporting the rotation member 251 when the flexible display 230 is withdrawn by the rotation of the rotation member 251. The elastic members 252 are respectively positioned on both sides of the rotation member 251 to provide the same elastic force to the flexible display 230.

A ring-shaped stopper 255 may be provided on one side of the support shaft 254 provided to pass through the elastic member 252 and the support cover 253. The stopper 255 may be positioned inside the support cover 253, and may be caught by a protruding portion (not shown) disposed on an inner surface of the support cover 253 while rolling or unrolling the flexible display 230, thereby limiting the rotation of the rotation member 251.

In other words, the stopper 255 may serve to limit the rotation of the rotation member 251, thereby limiting the movement of the flexible display 230.

The flexible display 230 may be inserted into or withdrawn from the first body 210 while being deformed by an external force.

The flexible display 230 may configured to be inserted into or withdrawn from the display movement hole 211a' disposed in the main cover member 211, and may be deformed to be rolled while being inserted into the first body 210. Furthermore, the flexible display 230 may be deformed to be unrolled while being withdrawn from the first body 210.

One end portion region of the flexible display 230 may be positioned to be inserted into the second body 220, and the flexible display 230 may move together with the second body 220.

When the user pulls the second body 220 to an outside of the first body 210 or pushes the second body 220 toward the first body 210 while the user holds the second body 220, the flexible display 230 may move in the same direction as the second body 220 since one end region thereof is fixed to the second body 220.

The flexible display 230 may be withdrawn from an inside of the first body 210 while being unrolled from the rotation member 251, and in this case, a region exposed to the outside may be extended. Furthermore, as the flexible display 230 is rolled into the first body 210, a region exposed to the outside may be reduced.

In other words, the flexible display 230 may be rolled or unrolled along the outer surface of the rotation member 251.

A flexible printed circuit board 263 may be provided at one end portion of the flexible display 230, and a driver IC 231 for operating the flexible display 230 and a connector 232 for connecting to a main printed circuit board 261 may be provided on one side of the flexible printed circuit board 263.

The rear plate 240 may be coupled to a rear surface of the flexible display 230. The rear plate 240 serves to support the flexible display 230, and as the flexible display apparatus 200 is changed from the first state to the second state, the rear plate may be transformed into a shape that surrounds an outside of the rotation member 251 together with the flexible display 230. In this case, the rear plate 240 may be rolled along the outer surface of the rotation member 251 together with the flexible display 230.

When the flexible display 230 and the rear plate 240 are rolled along the outer surface of the rotation member 251, the flexible display 230 may be implemented in an outward type positioned at an outer side than the rear plate 240. However, when the flexible display 230 is rolled around the rotation member 251, it may also be implemented in an inward type in which the rear plate 240 is positioned at an outer side and the flexible display 230 is positioned at an inner side.

As shown in FIG. 5, when the flexible display 230 is in a rolled state, the rear plate 240 may be formed of a thin super-elastic titanium alloy with a low thickness to minimize stress applied by the rear plate 240 supporting the flexible display 230 from the rear surface thereof.

Here, the super-elastic titanium alloy may be made of a material having a yield strain of approximately 2.0 to 2.5% (based on a thickness of 0.3 mm). In addition, the rear plate 240 may be made of not only a super-elastic titanium alloy, but also a titanium-nickel-based (Ti—Ni) alloy, a titanium-aluminum-based (Ti—Al) alloy, and a thin-film stainless steel (STS).

The second body 220 may be coupled to one end of the flexible display 230, and configured to move together with the flexible display 230. The second body 220 may be positioned adjacent to the first body 210 when the flexible display 230 is rolled into the first body 210. In addition, when the flexible display 230 is withdrawn from the first body 210, it may be positioned away from the first body 210. The second body 220 may be configured to have a smaller thickness than that of the first body 210.

The second body 220 may be configured to include a first member 221 and a second member 222 configured to be coupled to each other in contact with each other. The first member 221 may have a rectangular plate shape, and the second member 222 may be coupled to one surface thereof. The first member 221 and the second member 222 may be coupled to each other in such a manner that screws 223a are inserted into screw fastening holes 223b. A battery 262 and the main circuit board 261 may be provided in an inner space defined by the first member 221 and the second member 222.

When the flexible display 230 is completely inserted into the first body 210, the second member 222 may be positioned in contact with the outer surface of the first body 210, and the first member 221 may be positioned to face outward.

FIG. 6 shows a cross-sectional view in which the first body 210 is cut in a longitudinal direction. FIG. 7A is a longitudinal cross-sectional view of the flexible display apparatus 200 according to the present disclosure, and FIG. 7B is a conceptual view showing a shape of the flexible display 230 and the rear plate 240 supporting the same. Furthermore, FIGS. 8A and 8B are partially enlarged views showing a part of the flexible display 230 in a rolled state.

As described above, the flexible display 230 may be inserted into or withdrawn from the first body 210 while being deformed by an external force.

The flexible display 230 may be deformed to be unrolled along the rotation member 251 while being inserted into the first body 210 as passing through the display movement hole 211a' disposed in the main cover member 211. Furthermore, the flexible display 230 may be deformed to be unrolled in order to implement a large screen while being withdrawn from the first body 210.

In other words, the flexible display apparatus 200 may include a first state in which a least part of the flexible display 230 can be rolled into the first body 210 while being inserted into the first body 210, and a second state in which the flexible display 230 is unrolled together with the second body 220 while being withdrawn from an inside of the first body 210.

As shown in FIG. 6, the flexible display 230 may be configured to be rolled along the outer surface of the rotation member 251 provided inside the first body 210 while being deformed in a bent state. In this case, when viewed from the outside, as shown in FIG. 7A, when the flexible display 230 is positioned inside the first body 210 in a rolled state, the first body 210 and the second body 220 will be in close contact with each other.

The rear plate 240 may be coupled to a rear surface of the flexible display 230. At this time, as shown in FIG. 7B, an adhesive layer 233 may be disposed between the flexible display 230 and the rear plate 240, and the adhesive layer 233 serves to allow coupling between the flexible display 230 and the rear plate 240 to be closer contact with each other.

The flexible display 230 may be rolled along the outer surface of the rotation member 251 configured to be rotatable inside the main cover member 211.

The fixing groove of the rear plate 240 may be disposed on the outer surface of the rotation member 251 along an extension direction of the rotation member 251. As shown in FIG. 7A, one end portion of the rear plate 240 may be configured to have a larger left-right length than the flexible display 230, and the bending portion 240a may be disposed at one end portion of the rear plate 240 extending beyond the flexible display 230. The bending portion 240a disposed at one end portion of the rear plate 240 may be configured to be bent in a direction toward the rotation member 251 so as to be inserted into and fixed to the fixing groove of the rear plate 240.

Specifically, the bent end portion of the rear plate 240 may be provided to be inserted into the rear plate fixing groove 251b. Accordingly, when the rotation member 251 rotates inside the first body 210, the flexible display 230 and the rear plate 240 can be rolled along the outer surface of the rotation member 251 while the bending portion 240a of the rear plate 240 is fixed to the rear plate fixing groove 251b.

At this time, the flange parts may be disposed at both ends of the rotation member 251 to prevent the flexible display 230 rolled along the outer surface of the rotation member 251 from being released to the outside. The bending portion 240a can be inserted into the rear plate fixing groove 251b, and then bonded thereto.

Furthermore, as shown in FIG. 8A, an elastic member accommodating portion 251a in which the elastic member 252 is accommodated and configured to protrude in an outward direction may be disposed at the flange part. The elastic member 252 may be positioned in the elastic member accommodating portion 251a, and the support cover 253 may be inserted into the elastic member accommodating portion 251a. In other words, it has a structure in which the elastic member 252 is provided between the elastic member accommodating portion 251a and the support cover 253.

The elastic member 252 may be provided such that one end thereof is fixed to the support shaft 254 provided to pass through the support cover 253, and the elastic member 252 may be configured to provide an elastic force for supporting the rotation member 251 when the flexible display 230 is withdrawn. In this case, the elastic members 252 may be respectively positioned on both sides of the rotation member 251 to provide the same elastic force to the flexible display 230. In this case, a ring-shaped stopper 255 may be provided at one side of the support shaft 254 provided to pass through the elastic member 252 and the support cover 253, and caught by the protruding portion (not shown) disposed on an inner surface of the support cover 253 while rolling or unrolling the flexible display 230, thereby limiting the rotation of the rotation member 251.

FIG. 9A is a conceptual view showing an inner shape of the second body 220 while the first body 210 and the second body 220 are in close contact with each other, and FIG. 9B is a conceptual view showing an inner shape of the second body 220 while the display is unrolled.

The description is the same as described above in that the flexible display apparatus 200 may include a first state in which a least part of the flexible display 230 is rolled into the first body 210 while being inserted into the first body 210, and a second state in which the flexible display 230 is unrolled together with the second body 220 while being withdrawn from an inside of the first body 210. Accordingly, a description thereof will be omitted within the duplicate range.

The second body 220 may be coupled to one end of the flexible display 230, and configured to move together with the flexible display 230. The second body 220 may be positioned adjacent to the first body 210 when the flexible display 230 is rolled into the first body 210. In addition, when the flexible display 230 is withdrawn from the first body 210, it may be positioned away from the first body 210.

The second body 220 may be configured to include a first member 221 and a second member 222 configured to be coupled to each other in contact with each other. The first member 221 and the second member 222 may be coupled to each other in such a manner that screws 223a are inserted into screw fastening holes 223b.

The second body 220 may have a structure in which electronic components are disposed in an inner space defined while the first member 221 and the second member 222 are coupled to each other.

For example, the battery 262 and the main circuit board 261 may be provided in an inner space defined by the first member 221 and the second member 222.

Furthermore, the flexible printed circuit board 263 may be coupled to one end portion of the flexible display 230, and the flexible printed circuit board 263 may be provided with the driver IC 231 for providing driving signals and data to a display panel as electrical signals (multi high voltage level signals) to display characters or video images on the screen for the driving of the flexible display 230.

In other words, the flexible display apparatus 200 according to the present disclosure may have a structure in which the battery 262, the main circuit board 261, the flexible printed circuit board 263, and the driver IC 231 are disposed in a space defined by the coupling of the first member 221 and the second member 222.

FIG. 10 is a cross-sectional view showing an inner shape of the flexible display apparatus 300 according to another embodiment of the present disclosure.

A first magnet 311a having magnetism may be provided on one side of the main cover member 311 of the first body 310, and a second magnet 322a may be provided on one side of the second body 320.

When the flexible display 330 is positioned inside the first body 310 in a rolled state, the first body 310 and the second body 320 may be disposed adjacent to each other, and in this case, the first magnet 311a and the second magnet 322a may be positioned adjacent to each other to allow the second body 320 to be fixed to the first body 310 while being in close contact with each other by interaction. When the first magnet 311a and the second magnet 322a are positioned adjacent to each other, they may be configured to form an attractive force by a magnetic force.

The first magnet 311a may be positioned at an insertion portion of the first magnet 311a disposed to be recessed on an outer surface of the main cover member 311. When the first magnet 311a is positioned at the insertion part of the first magnet 311a, the outer surface of the main cover member 311 and an outer surface of the first magnet 311a may be positioned on the same plane.

The first magnet 311a may be configured in plurality to be provided at a plurality of positions along the outer surface of the main cover member 311.

The second magnet 322a may be provided on an outer surface of the second body 320. Specifically, the second magnet 322a may be provided on one side surface of a second member 322 constituting the second body 320. When the flexible display 230 is rolled into the first body 310, the second member 322 may be positioned to face an outer surface of the first body 310. Accordingly, the second magnet 322a may be provided on an outer surface of the second member 322, and may be configured in plurality to correspond to the first magnet 311a.

Furthermore, the second magnet 322a may be provided in an insertion groove of the second magnet 322a disposed to be recessed on the outer surface of the second member 322.

FIG. 11 is a conceptual view showing a shape in which support members are provided in a second body 420 according to still another embodiment of the present disclosure, and FIG. 12 is an exploded perspective view of the second body 420 in FIG. 11.

A flexible display apparatus 400 according to the present embodiment may include supporting members 470 configured to protrude from one side of the second body 420 in a second state in which a flexible display 430 is withdrawn from the first body 410.

The support members 470 may be configured to be rotatable from one side surface of the second member 422 constituting the second body 420 toward a front portion thereof.

As shown in FIG. 11, the support members 470 may be configured to support the flexible display 430 in a state of being withdrawn to the outside.

Since the first body 410 and the second body 420 have different heights when the flexible display 430 is in an unrolled state, when respective one side surfaces of the first body 410 and the second body 420 are positioned on a flat ground, the flexible display 430 is positioned to be inclined to one side, thereby causing inconvenience to the user. Accordingly, the user may withdraw the support members to allow the heights of the first body 410 and the second body 420 to be the same.

The support members may be provided in support member accommodation grooves 422b disposed to be recessed on one side surface of the second member 422. When the support members are seated in the support member accommodation grooves, the second member 422 may be configured to have a flat surface.

The support member may be configured in plurality so as to be stably supported on the ground, for example, it may consist of two pieces spaced apart from each other by a predetermined distance from one side surface of the second member 422.

FIG. 13 is a cross-sectional view showing an inner shape of a flexible display apparatus 500 to perform the driving of a first body 510 according to yet still another embodiment of the present disclosure.

As described above, the flexible display apparatus 500 may implement a first state in which at least part of a flexible display 530 is rolled into the first body 510, and a second state in which an area of the flexible display 530 exposed to the outside increases while being withdrawn from an inside of the first body 510.

Furthermore, as illustrated in FIGS. 1 to 12, the description is the same as described above in that since one end portion of a rear plate 540 coupled to a rear surface portion of the flexible display 530 is fixed to one side of a rotation member 520, the flexible display 530 can be rolled or unrolled along an outer surface of the rotation member 520 as the rotation member 520 rotates. Accordingly, a description thereof will be omitted in the duplicate range.

The flexible display apparatus 500 according to the present embodiment may include a motor 531, 532, a motor circuit 533, and a gear 534 to perform a one-way rotation of the rotation member 520.

The rotation member 520 may be provided inside the first body 510, and the rotation member 520 may be configured to receive a rotational force from the gear 534. The rotation member 520 may be configured to roll or unroll the flexible display 530 according to a rotation direction of the gear 534.

When a control signal is applied to the motor circuit 533, driving of the motor connected to the motor circuit may be carried out, and the gear 534 connected to the motor shaft may rotate a rotation shaft.

At this time, since the motor may require a large torque for rotation, a plurality of motors may be connected in series. Accordingly, as shown in FIG. 13, the motor may include a first motor 531 and a second motor 532 arranged in series.

FIG. 14 is a perspective view of a flexible display apparatus 600 according to still yet another embodiment of the present disclosure.

The flexible display apparatus 600 according to the present embodiment may further include a sub display 680 provided on a side surface portion of first body 610. The sub display 680 may be provided on an outer surface of a side cover member provided to cover both side surfaces of the first body 610.

The sub display 680 may constitute a screen for providing information to the user, for example, may output a screen to enable basic notification and confirmation such as a smart watch. However, since the sub display 680 has the same configuration and role as those of the flexible display described with reference to FIGS. 1 to 13, a description thereof will be omitted in the duplicate range.

The configurations and methods according to the above-described embodiments will not be applicable in a limited way to the foregoing flexible display apparatus, and all or part of each embodiment may be selectively combined and configured to make various modifications thereto.

The present disclosure may be implemented or applied in various ways to the production and use of a mobile terminal using a flexible display.

What is claimed is:

1. A flexible display apparatus, comprising:
   a first body;
   a flexible display configured to be inserted into or withdrawn from the first body while being deformed by an external force;
   a rotation member configured to be rotatable inside the first body;
   a second body coupled to one end of the flexible display;
   a rear plate coupled to a rear surface portion of the flexible display to be deformed together with the flexible display;
   a rear plate fixing groove extending along an extension direction of the rotation member; and
   a bent end portion of the rear plate inserted into and fixed to the rear plate fixing groove,
   wherein the flexible display is deformed so as to be rolled while being inserted into the first body, and is deformed so as to be unrolled while being withdrawn from the first body,
   wherein one end of the rear plate extends beyond the other end of the flexible display, which is different from the one end of the flexible display to which the second body is coupled to form an extended portion of the rear plate,
   wherein the one end of the flexible display is provided with a printed circuit board, and
   wherein the bent end portion is formed at one end of the extended portion of the rear plate, thereby forming the extended portion that exists between the flexible display and the bent end portion and is formed integrally with the bent end portion.

2. The flexible display apparatus of claim 1, wherein the flexible display is configured to allow a region exposed to the outside to be extended while being withdrawn from an inside of the first body, and configured to allow the region exposed to the outside to be reduced while being rolled into the first body.

3. The flexible display apparatus of claim 2, wherein a distance between the first body and the second body varies according to the rolled and unrolled state of the flexible display.

4. The flexible display apparatus of claim 1, wherein the first body comprises:
   a main cover member disposed in a polygonal pillar shape with both ends open and a storage space disposed therein;
   a side cover member configured to cover both sides of the main cover member.

5. The flexible display apparatus of claim 4, wherein a display movement hole cut with a predetermined width is disposed on one side of the main cover member to allow the insertion or withdrawal of the flexible display.

6. The flexible display apparatus of claim 4, wherein a sub display is provided on the side cover member to cover an outer surface thereof.

7. The flexible display apparatus of claim 4, wherein the flexible display is coupled to the rear plate, so as to be rolled along an outer surface of the rotation member together with the rear plate.

8. The flexible display apparatus of claim 1, wherein accommodating portions configured to protrude in a radial direction are disposed at both ends of the rotation member, respectively, and the accommodating portions support the flexible display rolled on an outer surface of the rotation member.

9. The flexible display apparatus of claim 8, wherein support covers are coupled to both sides of the rotation member, respectively, and an elastic member is provided at an inner side of the support cover, and the elastic member has one end fixed to a support shaft formed through the support cover, so as to provide an elastic force for supporting the rotation member.

10. The flexible display apparatus of claim 1, wherein the second body comprises a first member and a second member configured to be coupled to each other in contact with each other, and when the flexible display is completely inserted, the first member is positioned to face outward, and the second member is positioned in contact with an outer surface of the first body.

11. The flexible display apparatus of claim 1, wherein a first magnet is provided on an exterior surface of the first body, wherein the flexible display extends into the second body through an opening formed in a first side of the second body, wherein a second magnet is provided on a second side of the second body, and when the flexible display is rolled into the first body, the first magnet and the second magnet are positioned adjacent to each other, and interact to allow the second body to be fixed to the first body.

12. The flexible display apparatus of claim 10, wherein a support member configured to rotate toward a front portion thereof, and disposed to support the flexible display withdrawn to the outside is mounted on one side surface of the first member.

13. The flexible display apparatus of claim 11, wherein electronic components are provided in an inner space defined by the first member and the second member in the second body.

14. The flexible display apparatus of claim 1, wherein the other end of the flexible display is spaced from the bent end of the rear plate.

15. The flexible display apparatus of claim 1, further comprising a main circuit board in the second body; and a connector between the main circuit board and the printed circuit board.

* * * * *